(12) United States Patent
Woo et al.

(10) Patent No.: US 6,531,777 B1
(45) Date of Patent: Mar. 11, 2003

(54) BARRIER METAL INTEGRITY TESTING USING A DUAL LEVEL LINE TO LINE LEAKAGE TESTING PATTERN AND PARTIAL CMP

(75) Inventors: Christy Mei-Chu Woo, Cupertino, CA (US); Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/599,839

(22) Filed: Jun. 22, 2000

(51) Int. Cl.[7] ............................................... H01L 23/48
(52) U.S. Cl. ...................... 257/752; 257/751; 257/758; 257/762; 257/763; 257/767
(58) Field of Search ................................ 257/741, 750, 257/751, 752, 758, 761, 762, 763, 764, 767

(56) References Cited

U.S. PATENT DOCUMENTS

| | | | | |
|---|---|---|---|---|
| 5,903,053 A | * | 5/1999 | Iijima et al. ................. 257/751 |
| 5,969,422 A | * | 10/1999 | Ting et al. ................... 257/762 |
| 5,973,400 A | * | 10/1999 | Murakami et al. .......... 257/751 |
| 6,037,664 A | * | 5/2000 | Zhao et al. ................... 257/758 |
| 6,144,096 A | * | 11/2000 | Lapatin ....................... 257/751 |
| 6,184,138 B1 | * | 2/2001 | Ho et al. ..................... 438/687 |
| 6,229,211 B1 | * | 5/2001 | Kawanoue et al. ......... 257/751 |
| 6,265,320 B1 | * | 7/2001 | Shi et al. ..................... 438/725 |
| 6,265,779 B1 | * | 7/2001 | Grill et al. ................... 257/759 |
| 6,323,555 B1 | * | 11/2001 | Maex et al. ................. 257/758 |

* cited by examiner

Primary Examiner—George Eckert
(74) Attorney, Agent, or Firm—Gerald Fisher; Deborah Wenocur

(57) ABSTRACT

A structure and method for determining barrier layer integrity for multi-level copper metallization structures in integrated circuit manufacturing. Novel testing structures prevent any conducting residues of the copper CMP from diffusing into the dielectric layer. Barrier layer integrity is tested by performing leakage or other electrical measurements between copper features on two different metal levels.

20 Claims, 5 Drawing Sheets

BARRIER METAL INTEGRITY TESTING USING A DUAL LEVEL LINE TO LINE LEAKAGE TESTING PATTERN AND PARTIAL CMP

CROSS REFERENCE TO A RELATED APPLICATION

This application is related to the commonly owned co-pending application Ser. No. 09/514,413, filed Feb. 28, 2000.

FIELD OF THE INVENTION

This invention relates to integrated circuit processing, and in particular to structures for testing the integrity of barrier metal layers used in multilevel metallization structures employing copper.

BACKGROUND OF THE INVENTION

As integrated circuit devices shrink, with semiconductor device geometries approaching 0.18 micron minimum feature size, and as circuit speed and performance increase, copper has replaced aluminum as the preferred electrical interconnect material. The use of copper as an interconnect material in silicon integrated circuits has occurred in response to the need for lowered interconnect resistivity, good electromigration resistance, and good deposition characteristics which allow effective filling of vias and contacts.

Copper metallization structures are often formed by a process known as Damascene, which is illustrated in FIG. 1. An insulating layer known as the Interlevel Dielectric (ILD) separates metal layers in a multilevel metallization structure. ILD dielectric layer 2, which may be comprised of a bottom layer 4 and a top, low dielectric constant layer 6, has Darnascene line regions 8 etched therein into which the metal lines will be inlaid. A barrier layer 10 is deposited, which serves to prevent diffusion of copper from the metal lines into the dielectric. This barrier layer is generally comprised of Ta or Ta compounds. A copper seed layer is then generally deposited, followed by an electroplated copper layer. The excess copper is then removed by a process known as Chemical Mechanical Polishing (CMP), leaving embedded copper lines 18, 20. A capping layer 16, typically comprised of silicon nitride, is generally deposited atop copper lines 18, 20 to prevent copper corrosion.

The integrity of the barrier layer 10 is critical to preventing diffusion of Cu into nearby dielectric or silicon regions. Diffused Cu in Si can cause degradation of device characteristics, such as leakage currents in reverse biased junctions. Cu defects in dielectrics can cause threshold voltage shifts and parasitic leakage currents. It is therefore essential to utilize methods for testing and/or monitoring barrier layer integrity. Barrier layer integrity tests can be utilized during development of barrier layer deposition processes, and they may be incorporated into manufacturing processes for monitoring during production.

In the prior art, barrier layer integrity has been evaluated by monitoring the line-to-line leakage current. In this method, unconnected, spaced apart copper lines are electrically stressed at higher electric field or temperature than would occur during normal circuit operation, and the leakage current between the lines is measured as an indication of copper diffusion through the barrier layer.

This prior art method for testing barrier layer integrity has inherent inaccuracies. Under temperature or voltage stress, Cu ions will diffuse across the lowest resistance path. The lowest resistance path may be a path which passes through the barrier layer, but it may instead be a path across the top dielectric surface, and accordingly falsely indicate lack of barrier layer integrity. In this prior art, a nitride capping layer 16 is generally deposited atop the Cu and dielectric surface to prevent the copper surface from oxidizing or corroding, and to isolate the copper line from the dielectric. One potential Cu diffusion path under stress is the nitride/dielectric interface. This effect is greatly magnified if electrically conducting residues remain on the dielectric surface after CMP, due to incomplete polish or ineffective or insufficient post-CMP clean. Other sources of residues include improper processing of the nitride cap layer.

SUMMARY OF THE INVENTION

It is therefore an object of this invention to provide an improved method of testing barrier layer integrity in an multilevel copper metallization structure used in integrated circuits.

It is a further object of this invention to provide an improved method of testing barrier layer integrity in an multilevel copper metallization structure used in integrated circuits which measures leakage currents between two different metal levels.

DETAILED DESCRIPTION OF THE INVENTION

Figure 1:
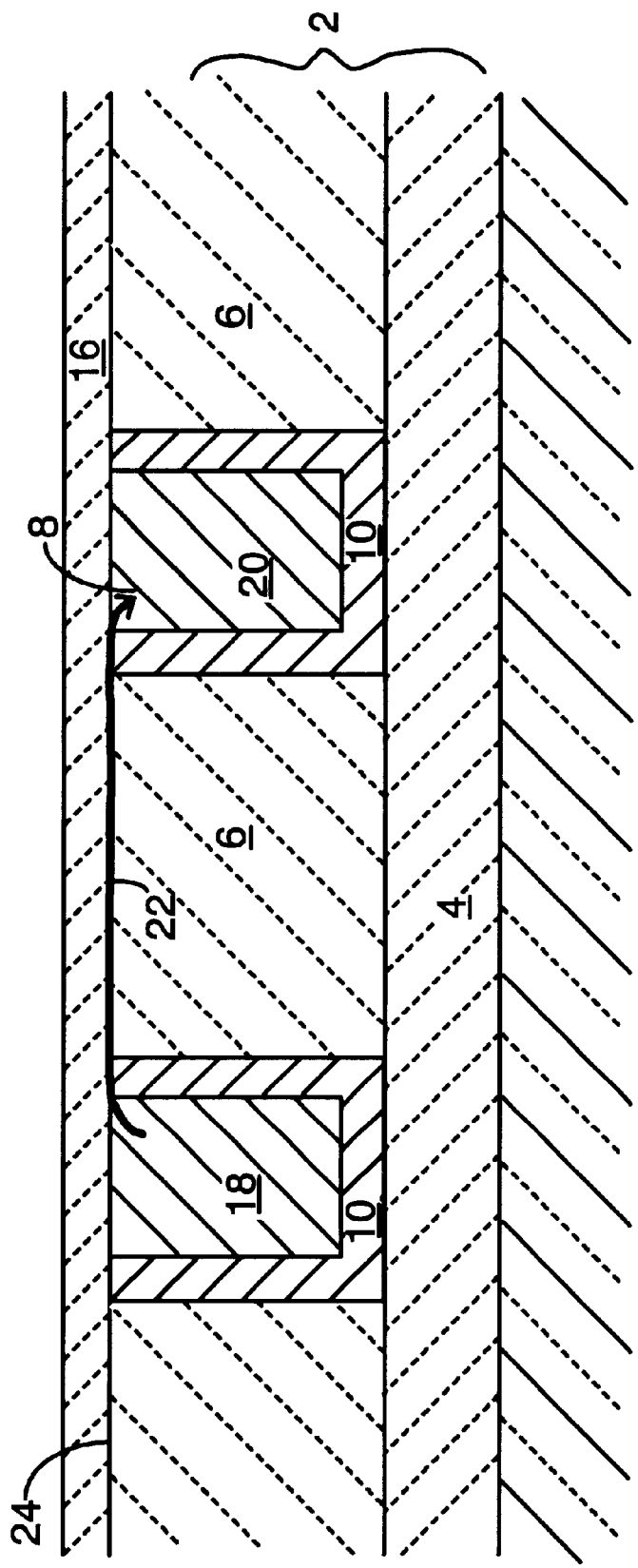
FIG. 1 illustrates a prior art copper Damascene metallization structure.

FIG. 1 shows the prior art Damascene structure, and includes likely copper diffusion path 22 which may result in measured line-to-line leakage, even if barrier layer 10 is intact. Copper atoms can easily diffuse along interface 24 between dielectric layer 6 and capping layer 16.

Figure 2:
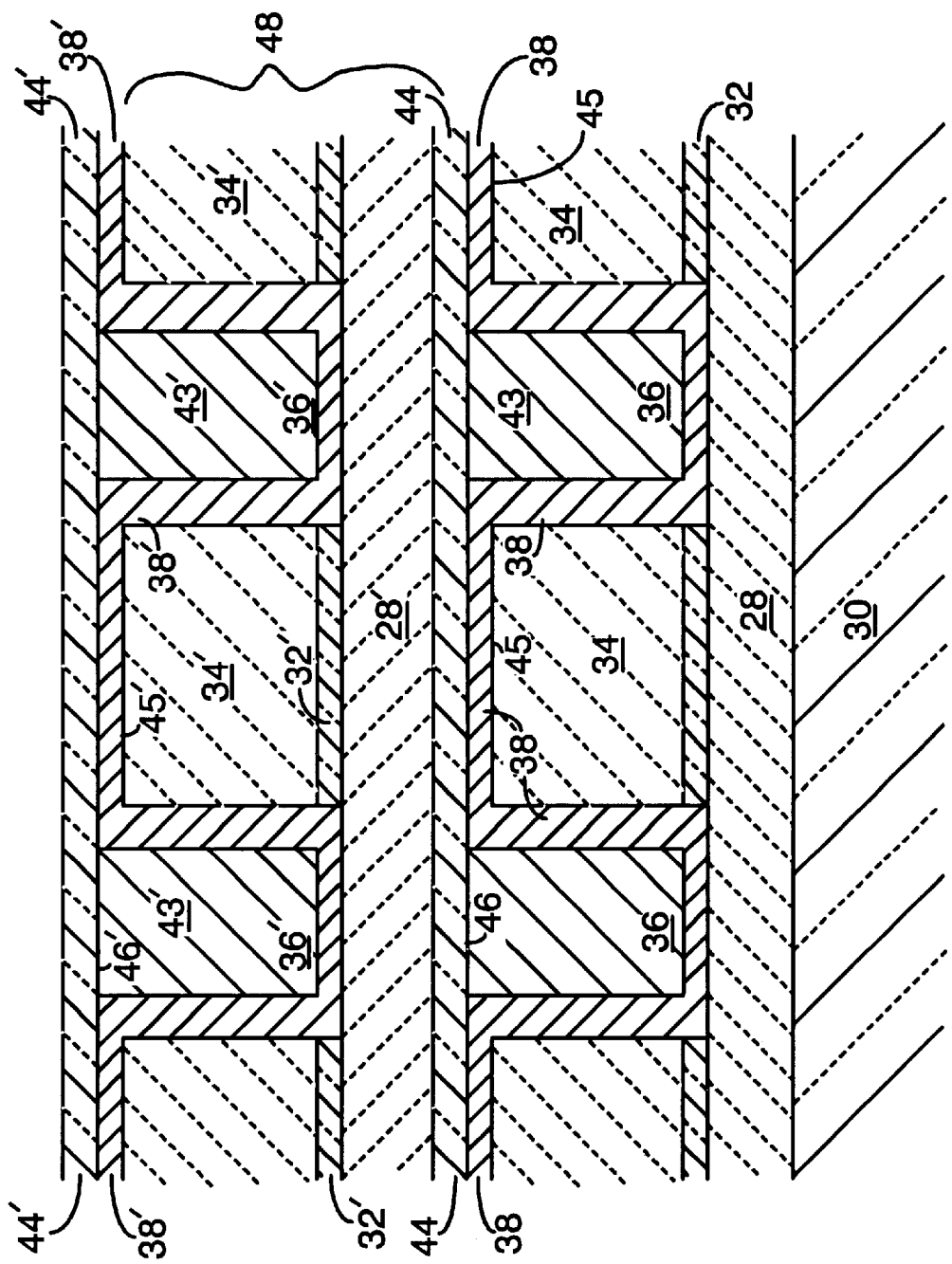
FIG. 2 is a cross section of a first embodiment of the inventive structure, with upper and lower patterned metal lines.

FIG. 2 shows a cross section of a first embodiment of the inventive structure, wherein leakage current is measured between two metal levels. Our invention provides test structures which prevent any conducting residues of the copper CMP from diffusing into the dielectric layer and which also inhibit diffusion of copper from the copper Damascene lines into the dielectric by any paths other than through the barrier layer. This is accomplished by providing a "low permeability" layer which has low permeability to copper diffusion atop the dielectric layer and abutting the barrier layer in the Damascene line region. Electrical characteristics are then measured vertically between two metal levels rather than across the wafer surface, which provides a better measure of copper ion diffusion through the barrier material into the dielectric.

The first embodiment as shown in FIG. 2 is utilized with single Damascene structures on two successive metal levels, but can be extended to dual Damascene structures. The Damascene structure is formed according to known methods, as described hereinafter. Thin layer 28 of dielectric such as PETEOS, 2000 Angstroms thick by way of example with an expected acceptable range of 1000–5000 Angstroms, is deposited on silicon wafer 30. Thin nitride layer 32 with a thickness of 250–1000 Angstroms is deposited as an etch stop. Dielectric layer 34, 4000–5000 Angstrom thick PETEOS by way of example with an expected acceptable range of 1000–15000 Angstroms, is deposited atop nitride layer 32. Dielectric layer 34 may also be comprised of a low-k dielectric material such as: polyimide, Hydrogen Silsesquioxane (HSQ), Methyl Silsesquioxane (MSQ), Bezocyclobutene (BCB), Fluorinated Glass (FSG), Flourinated Aromatic Ether (FLARE), Inter-Penetrated SOG (IPS), spin-on polymer low-k such as SILK™ from Dow Chemical, spin-on ultra-low k such as Nanoglass™ from Allied Signals, CVD low-k such as Coral™ from NVLS or Black Diamond™ from Applied Materials. Dielectric 34 is patterned and etched to provide lower level Damascene lines 36 into which copper will be deposited, with the dielectric etch stopping at nitride etch stop layer 32. Nitride layer 32 is then removed from the lower level Damascene line regions 36 with a second etching step. Barrier layer 38, generally with a thickness between 25–400 Angstroms, is next deposited. Barrier layer 38 is generally comprised of Ta, but may also be comprised of Ti, TiN, TaN, WN, WSiN, TaSiN, TiSiN, WC, or TaC, deposited either by Chemical Vapor Deposition (CVD), Physical Vapor Deposition (PVD), or Atomic Layer Deposition (ALD). A copper seed layer is then deposited, followed by an electroplated copper layer which fills lower level Damascene line regions 36 and which also is deposited atop barrier layer 38 atop dielectric 34. Post plating anneal to approximately 100 C. to 450 C. is performed. Copper CMP is then performed to removed excess copper from atop dielectric 34, leaving lower level copper lines 43.

In conventional Damascene processing, the copper CMP polishes off both copper layer 43 and barrier layer 38 from the dielectric surface. In contrast, in the first embodiment of our inventive process, CMP is stopped on barrier layer 38, leaving the barrier intact atop the dielectric surface 45 in the field regions. Post-CMP capping layer 44, nitride by way of example, is deposited to prevent copper surface 46 from oxidizing.

ILD layer 48 comprising: first dielectric layer 28', which is of sufficient thickness to electrically isolate the lower and upper metal layers, approximately 5000 A by way of example; nitride layer 32'; and second dielectric layer 34', is next deposited atop capping layer 44. Upper level Damascene lines 43' are then formed according to the process outlined above for the lower level Damascene structure.

In order to test for diffusion of copper into the dielectric, copper lines 43 and 43' are subjected to bias temperature stressing while monitoring the leakage current between copper lines 43 and 43' on lower and upper metal levels respectively. The upper level metal is connected to a voltage source while the lower level is grounded. The test can either be performed using a constant voltage or a voltage ramp.

In the voltage ramp test, the voltage on upper level metal lines 43' is ramped up and the leakage current in the lower level 43 is monitored. The measured leakage current is only due to diffusion of Cu+ ions through the barrier. Due to the design of the test structure, the component of leakage due to diffusion of Cu+ ions along the top nitride interface 24 is eliminated. The voltage ramp test can be used as a wafer level reliability monitor and can be implemented periodically to check the integrity of the barrier.

In the constant voltage test, a constant voltage is applied to the upper metal level 43'. The time required for the leakage current in the lower metal level 43 to rise above a predetermined level (referred to as the Failure criteria) is monitored. The time to fail can then be extrapolated to operating conditions of the product using a suitable lifetime model to determine the lifetime. Both of the above types of tests can be utilized to evaluate the integrity and/or reliability of the barrier 38', since the leakage current is solely due to copper diffusion through the barrier layer.

Figure 3:
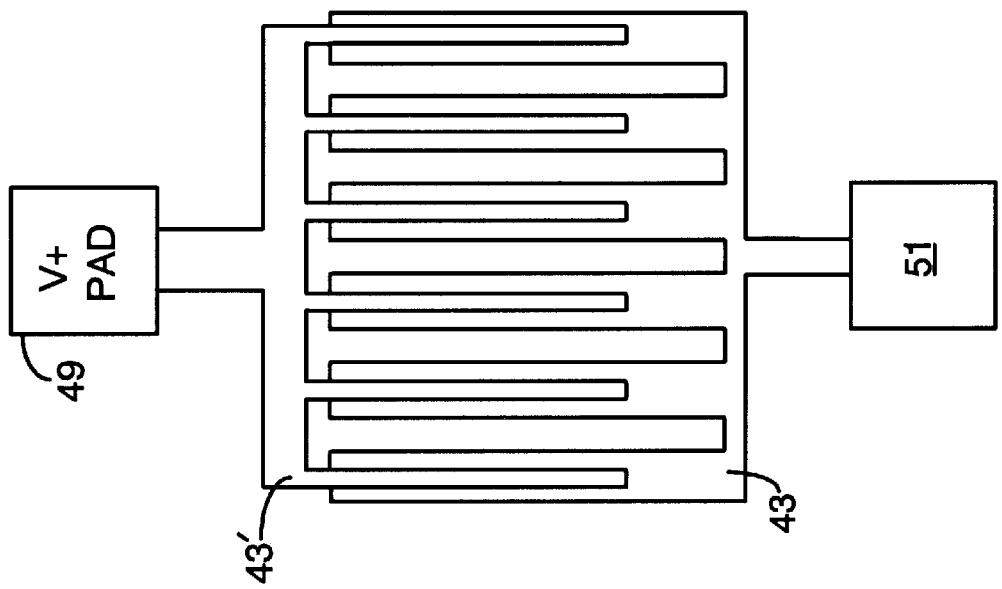
FIG. 3 shows a possible measurement pad configuration.

The copper lines may be contacted in standard ways, such as by providing large contact pads electrically connected to the copper lines in question, then masking and opening windows to expose the contact pads. A possible pad configuration is illustrated in FIG. 3. V+ pad 49 is connected to upper level metal 43', and ground pad 51 is connected to lower level metal 43. Electrical testing is performed using such standard measurement hardware as the S900 Tester made by Keithley, and the HP 4071 Tester made by Hewlett-Packard.

According to this embodiment, the presence of the remaining intact barrier layers 38 and 38' atop dielectric surfaces 45 and 45' provide the aforementioned low permeability layers, and inhibit diffusion of copper into dielectric 34 and 34' except through barrier layers 38 and 38'. There is no alternate low resistance diffusion path for copper which would affect the electrical measurements, in contrast to the prior art method of measuring line-to-line leakage on a single metal level. Therefore, the vertical electrical characteristics measured between metal lines on different metal levels, rather than across the wafer surface, provide a better measure of copper ion diffusion through the barrier material into the dielectric.

Due to the presence of the conducting barrier layer material across the field regions, this embodiment is designed to be used for test or development wafers only, since line-to-line shorting would occur if this structure were formed on product wafers.

Figure 4:
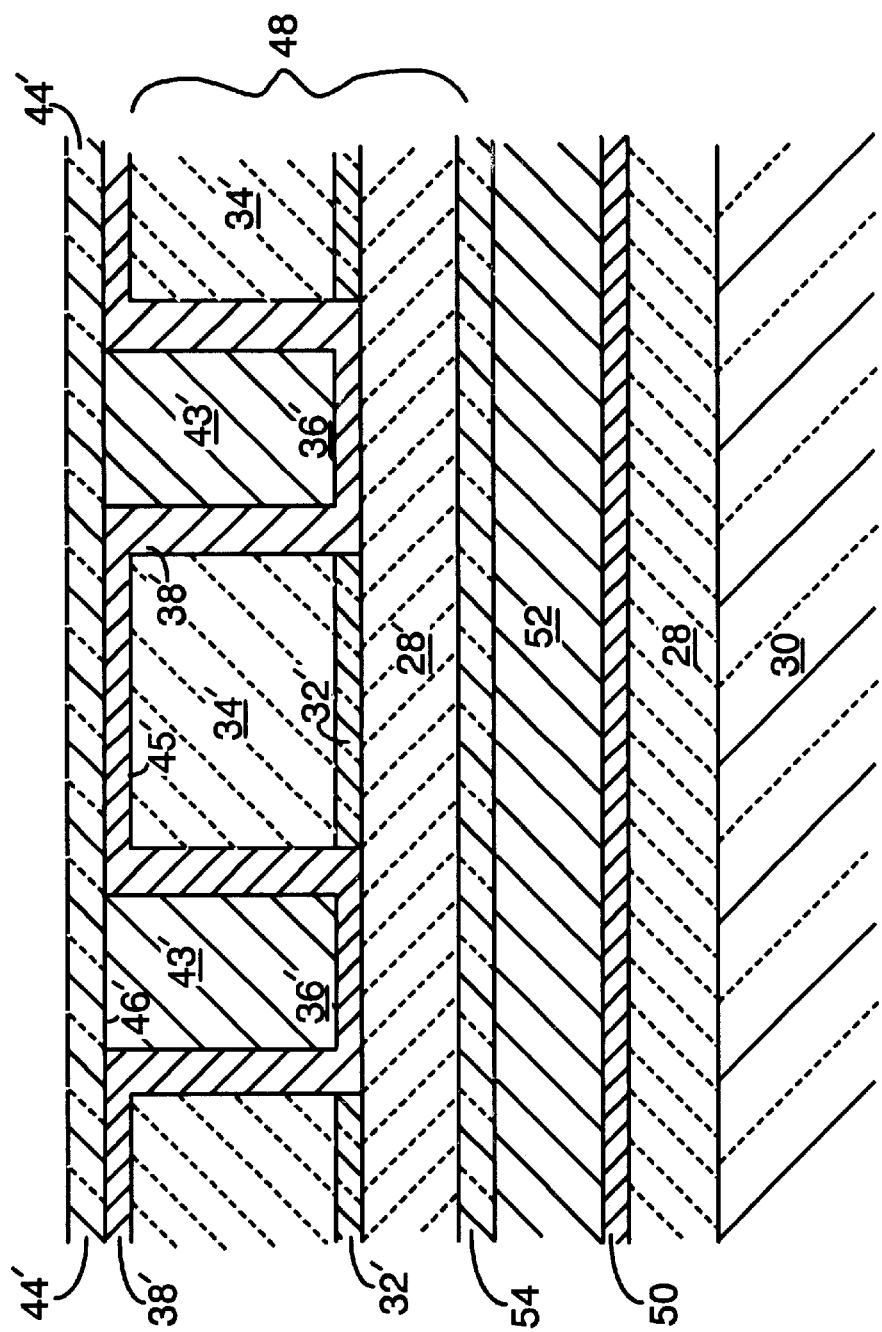
FIG. 4 shows a variation of the first embodiment of the inventive structure, with a blanket lower level metal.

A variation of this first embodiment is shown in FIG. 4, wherein the bottom metal level does not have patterned lines and spaces, but rather is a blanket metal layer, which would make the fabrication easier. Fabrication of the structure shown in FIG. 4 would simply comprise: 1) depositing blanket adhesion layer 50, Ta by way of example, atop dielectric layer 28; 2) depositing Cu layer 52; 3) depositing nitride capping layer 54, then continuing with ILD layer 48 and patterning of upper level copper Damascene lines 43' as described above.

Figure 5:
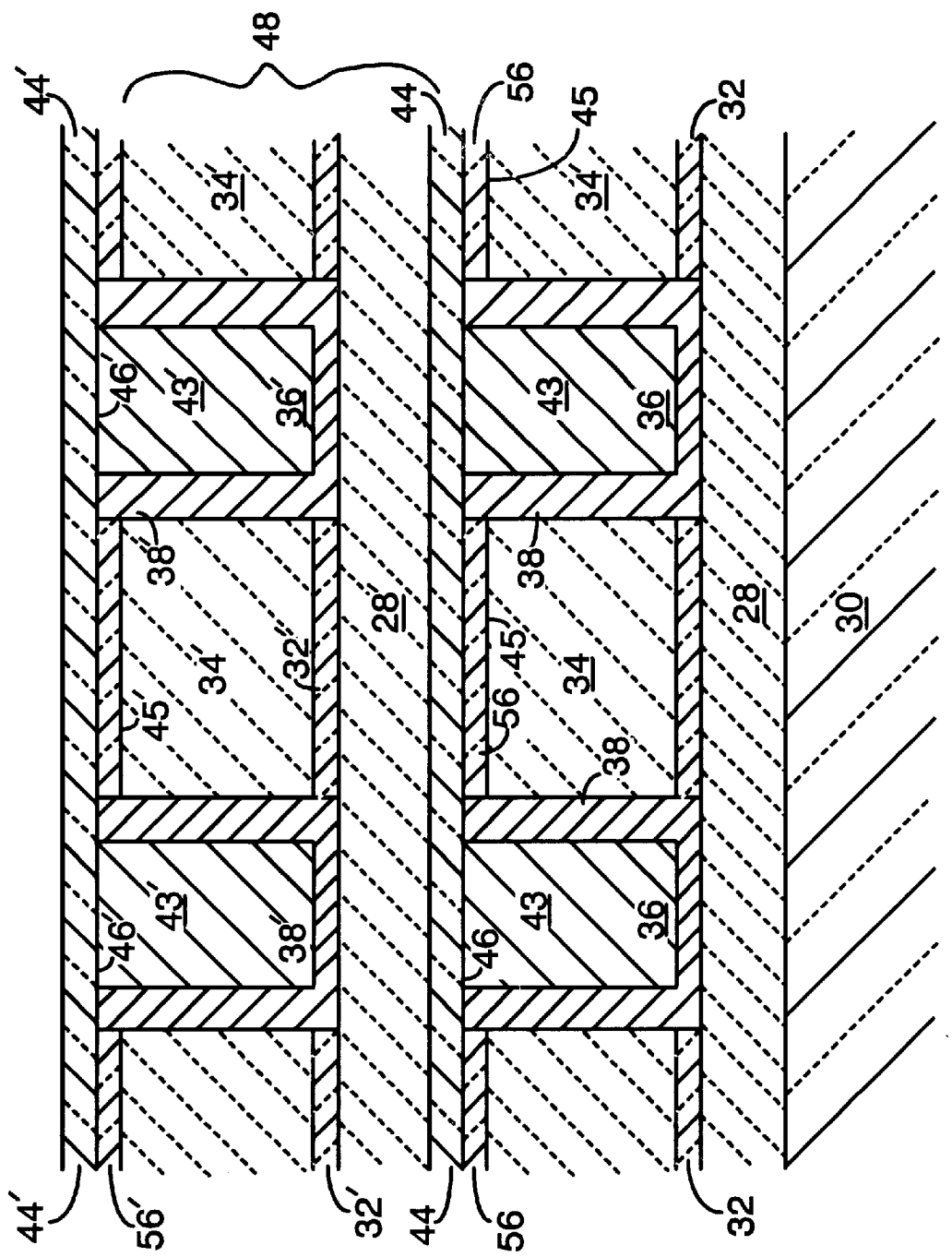
FIG. 5 shows a cross section of a second embodiment of the inventive structure.

A second embodiment of the invention uses a nitride capping layer atop dielectric surfaces prior to copper deposition and CMP to provide the aforementioned low permeability layer. This second embodiment is illustrated in FIG. 5. The embodiment as shown is utilized with a single Damascene structure, but can be extended to a dual Damascene structure.

The Damascene structure is formed similarly to the method of the first embodiment. Thin layer 28 of dielectric such as PETEOS, 2000 Angstroms thick by way of example with an expected acceptable range of 1000–5000 Angstroms, is deposited on silicon wafer 30. Thin nitride layer 32 with a thickness of 250–1000 Angstroms is deposited as an etch stop. Dielectric layer 34, 4000–5000 Angstrom thick PETEOS by way of example with an expected acceptable range of 1000–15000 Angstroms, is deposited atop nitride layer 32. Dielectric layer 34 may also be comprised of a low-k dielectric material as described for the first embodiment. A novel feature of this embodiment is that, subsequent to deposition of the thick dielectric layer 34, and prior to patterning of the dielectric, a thin nitride cap layer 56 of thickness 500–1000 Angstroms is deposited. Dielectric 34 is then patterned and etched to provide Damascene lines 36 into which copper will be deposited. Barrier layer 38 is next deposited. Barrier layer 38, generally with a thickness between 25–400 Angstroms, is generally comprised of Ta, but may also be comprised of Ti, TiN, TaN, WN, WSiN, TaSiN, TiSiN, WC, TaC, or a combination of any of the aforementioned, deposited either by CVD, PVD, or ALD. A copper seed layer is then deposited, followed by an electroplated copper layer which fills Damascene line regions 36 and which also is deposited atop barrier layer 38 atop dielectric 34. Post plating anneal to approximately 100 C. to 450 C. is performed. Copper CMP is then performed to removed excess copper and the barrier layer from atop dielectric 34, leaving copper lines 43. In this embodiment, in contrast to the first embodiment, the barrier layer 38 is removed by the CMP, and the CMP stops on nitride cap layer 56. A second, post-CMP cap layer 44, 500–1000 Angstroms of silicon nitride by way of example, is deposited to prevent copper surface 46 from oxidizing.

ILD layer 48 comprising: first dielectric layer 28', which is of sufficient thickness to electrically isolate the lower and upper metal layers, approximately 5000 A by way of example; nitride layer 32'; and second dielectric layer 34', is next deposited atop capping layer 44. Upper level Damascene lines 43' are then formed according to the process outlined above for the lower level Damascene structure. Copper lines 43 and 43' are subjected to bias temperature stressing while monitoring the leakage current between copper lines 43 and 43' on lower and upper metal levels respectively. The upper level metal is connected to a voltage source while the lower level is grounded. The test can either be performed using either of the aforementioned constant voltage or a voltage ramp tests. The copper lines may be contacted in standard ways, as illustrated in FIG. 3. Electrical testing is performed using such standard measurement hardware as the S900 Tester made by Keithley, and the HP 4071 Tester made by Hewlett-Packard.

According to this embodiment, the presence of nitride cap layers 56 and 56' atop dielectric surfaces 45 and 45' prior to copper deposition and CMP provide the aforementioned low permeability layers, and inhibit diffusion of copper into dielectric 34 and 34' except through barrier layers 38 and 38', due to the very low diffusion rate of copper through silicon nitride. Similarly, the copper CMP residues and other impurities from copper deposition and anneal on the surface of nitride capping layer 56 are inhibited from diffusing into dielectric 34. There is no likely alternate low resistance diffusion path for copper which would affect the electrical measurements, in contrast to the prior art method of measuring line-to-line leakage on a single metal level. Therefore, the vertical electrical characteristics measured between metal lines on different metal levels, rather than across the wafer surface, provide a better measure of copper ion diffusion through the barrier material into the dielectric.

In contrast to the structure of the first embodiment, in this embodiment there is no electrically conducting layer overlying the dielectric between metal lines. As a result, this embodiment may be utilized on product wafers as a structure that enables monitoring of barrier layer integrity. If it were desired to avoid having the nitride capping layer present on product circuit regions, a masking step could be employed to cover the test structures, and then the nitride capping layer could be etched off of the product regions. A second advantage of this embodiment, since the copper lines are not electrically connected, is that it may be utilized to determine across-the-wafer-uniformity of barrier layer integrity, if the test structures are designed to look at leakage currents at different locations on the wafer.

By utilizing our inventive structure and method, a much more reliable and unambiguous indication of barrier layer integrity can be obtained. This can assist both in development of barrier layer materials and deposition methods, but can also be used in production to monitor barrier layer integrity. The use of our inventive structure can also indirectly detect the presence of conducting CMP residues, by comparison of leakage between lines on different metal levels and line-to-line leakage on a single metal level. Our structure can be incorporated into existing testing processes, since leakage currents are routinely measured in wafer testing, and no additional steps such as depositing metal on the wafer backside are required.

It is not intended that our invention be restricted to the exact embodiments described herein. For example, different materials may be used for the dielectric or the barrier layer without altering the inventive concept. The scope of the invention should be construed in view of the claims.

With this in mind, we claim:

1. A structure for testing the integrity of a barrier layer underlying copper lines in a Cu metallization structure comprising:

a semiconductor substrate (30);

a lower dielectric layer {(28) and (34), FIG. 2 and FIG. 5, respectively; (28), FIG. 4} on said substrate, said lower dielectric layer having a top surface;

a lower barrier layer {(38), FIG. 2; (50), FIG. 4} atop said lower dielectric layer;

a lower copper feature {(36), FIG. 2 and FIG. 5; (52), FIG. 4} atop at least a portion of said lower barrier layer, said lower copper feature having a top surface;

a lower cap layer {(44), FIG. 2 and FIG. 5; (54), FIG. 4}, said lower cap layer being contiguously on said top surface of said lower copper feature and being atop said top surface of said lower dielectric layer;

an upper dielectric layer (48) atop said lower cap layer, said upper dielectric layer having an upper Damascene line region etched therein, said upper Damascene line region having a bottom surface and side surfaces, said upper dielectric layer having a top surface (45');

a first upper barrier layer portion (38') being of low permeability to copper diffusion on said bottom and said side surfaces of said upper Damascene line region (36') and filling a first portion of said upper Damascene line region, a remaining portion of said upper Damascene line region not being filled with said upper barrier layer;

said remaining portion of said upper Damascene line region being filled with upper copper (43'), said upper copper having a top surface (46');

said upper copper being electrically isolated from said lower copper feature by said upper dielectric layer;

a first upper cap layer (44'), said first upper cap layer being contiguously on said top surface of said upper copper and being atop said top surface of said upper dielectric layer;

a second low permeability portion {(38'), FIG. 2 and FIG. 4; (56'), FIG. 5} having low permeability to copper diffusion therethrough, said second low permeability portion being contiguous to and on said top surface (45') of said upper dielectric layer, said second low permeability portion also being contiguous to and below said first upper cap layer (44');

said second low permeability portion abutting said barrier layer on said side surface of said upper Damascene line region;

a first electrical contact (51) to said top surface of said lower copper feature and a second electrical contact (49) to said top surface of said upper copper for enabling electrical characteristic measurement between said first and second electrical contacts indicative of integrity of said upper barrier layer.

2. The structure of claim 1, wherein said upper barrier layer has a thickness in the range of 25–400 Angstroms and is comprised of a material selected from the group consisting of:

Ta, CVD Ta, CVD Ti, CVD TiN, CVD TaN, CVD WN, CVD WSiN, CVD TaSiN, CVD TiSiN, PVD Ta, PVD Ti, PVD TiN, PVD TaN, PVD WN, PVD WSiN, PVD TaSiN, PVD TiSiN, WC, CVD WC, ALD WC, TaC, CVD TaC, ALD TaC, and combinations thereof.

3. The structure of claim 2, wherein said upper barrier layer is Ta.

4. The structure of claim 1, wherein said first upper cap layer comprises silicon nitride and has a thickness in the range between 500–1000 Angstroms.

5. The structure of claim 1, wherein said upper dielectric layer includes a first portion underlying said upper Damascene line region and a second portion not underlying said upper Damascene line region, and wherein said second portion not underlying said upper Damascene line region includes a first (28') and a second (34') dielectric layer separated by an etch stop layer (32').

6. The structure of claim 5, wherein said second upper dielectric layer portion includes a low-k dielectric layer (34').

7. The structure of claim 6, wherein said low-k dielectric layer is chosen from the group consisting of:

polyimide, Hydrogen Silsesquioxane (HSQ), Methyl Silsesquioxane (MSQ), Bezocyclobutene (BCB), Fluorinated Glass (FSG), Flourinated Aromatic Ether (FLARE), Inter-Penetrated SOG (IPS), spin-on polymer low-k, spin-on ultra-low-k, CVD low-k.

8. The structure of claim 5, wherein said second upper dielectric layer portion not underlying said upper Damascene line region comprises:

a first PETEOS layer (28');

said etch stop layer (32') being a silicon nitride layer atop said first PETEOS layer; and a second PETEOS layer (34') atop said etch stop layer.

9. The structure of claim 8, wherein said first PETEOS layer has a thickness in the range between 1000 and 5000 Angstroms;

said silicon nitride etch stop layer has a thickness in the range between 250 and 1000 Angstroms; and said second PETEOS layer has a thickness in the range between 1000 and 15000 Angstroms.

10. The structure of claim 1, wherein said first and second electrical contacts comprise first and second contact pads.

11. The structure of claim 1, wherein said second low permeability portion comprises an extension of said upper barrier layer {(38'), FIG. 2 and FIG. 4)} and is composed of said upper barrier layer material.

12. The structure of claim 1, wherein said second low permeability portion comprises a second upper cap layer (56'), said second upper cap layer having low copper diffusivity therethrough, said second upper cap layer abutting and being contiguous with said first upper barrier layer portion on said side surface of said upper Damascene region.

13. The structure of claim 12, wherein said second upper cap layer comprises silicon nitride and has a thickness in the range between 500 and 1000 Angstroms.

14. The structure of claim 13 further including impurities between said first upper cap layer (44') and said second upper cap layer (56').

15. The structure of claim 1, wherein said lower copper feature comprises a blanket copper layer atop said lower barrier layer.

16. The structure of claim 1, wherein said lower copper feature comprises a lower Damascene line region filled with copper.

17. The structure of claim 1, formed by a method comprising the steps of:

depositing a lower dielectric layer on said substrate, said lower dielectric layer having a top surface;

depositing a lower barrier layer atop said lower dielectric layer;

forming a lower copper feature atop at least a portion of said lower barrier layer, said lower copper feature having a top surface;

depositing a lower cap layer, said lower cap layer being contiguously on said top surface of said lower copper feature and being atop said top surface of said lower dielectric layer;

depositing an upper dielectric layer atop said lower cap layer, etching a patterned upper Damascene line region into said upper dielectric layer, said Damascene line region having a bottom surface and sidewall surfaces;

depositing an upper barrier layer of low permeability to copper diffusion onto said upper dielectric layer and onto said bottom and sidewall surfaces of said upper Damascene line region;

forming an upper copper layer on said upper barrier layer, said upper copper layer filling said upper Damascene line region, a first portion of said upper copper layer being atop said upper barrier layer atop said upper dielectric layer, a second portion of said upper copper layer being atop said upper barrier layer on said bottom surface of said upper Damascene line region;

Chemically-Mechanically-Polishing (CMP) said upper copper layer until said portion of said upper copper layer atop said upper barrier layer atop said upper dielectric layer is removed, said second portion of said upper copper layer atop said upper barrier layer on said bottom surface of said upper Damascene line region remaining and having a top surface;

said CMP stopping on said upper barrier layer atop said upper dielectric layer such that said upper barrier layer atop said upper dielectric layer remains intact;

depositing a first upper cap layer contiguously on said top surface of said second portion of said upper copper layer and atop said upper barrier layer atop said upper dielectric layer;

forming an electrical contact on said top surface of said lower copper feature;

measuring electrical characteristics between said upper copper layer and said electrical contact on said top surface of said lower copper feature, said electrical characteristics being selected from the group consisting of CV characteristics, I-V characteristics, and resistivity.

18. The structure of claim 17, wherein:

said upper barrier layer is Ta, and said first upper cap layer is silicon nitride.

19. The structure of claim 1, formed by the process comprising the steps of:
- depositing a lower dielectric layer on said substrate, said lower dielectric layer having a top surface;
- depositing a lower barrier layer onto said lower dielectric layer;
- forming a lower copper feature on at least a portion of said lower barrier layer, said lower copper feature having a top surface;
- depositing a lower cap layer, said lower cap layer being contiguously atop said top surface of said lower copper feature and being atop said top surface of said lower dielectric layer;
- depositing an upper dielectric layer atop said lower cap layer,
- depositing a second upper cap layer onto said dielectric layer;
- etching a patterned upper Damascene line region through said second upper cap layer into said upper dielectric layer, said Damascene line region having a bottom surface and sidewall surfaces;
- depositing an upper barrier layer atop said upper dielectric layer and onto said bottom and sidewall surfaces of said upper Damascene line region;
- forming an upper copper layer atop said upper barrier layer, said upper copper layer filling said upper Damascene line region, a first portion of said upper copper layer being atop said upper barrier layer atop said upper dielectric layer, a second portion of said upper copper layer being atop said upper barrier layer on said bottom surface of said upper Damascene line region;
- Chemically-Mechanically-Polishing (CMP) said upper copper layer until said portion of said upper copper layer atop said upper barrier layer atop said upper dielectric layer is removed;
- said CMP stopping on said second upper cap layer atop said upper dielectric layer such that said second upper cap layer atop said upper dielectric layer remains intact;
- depositing a first upper cap layer atop said top surface of said second portion of said upper copper layer and atop said second upper cap layer atop said upper dielectric layer;
- forming an electrical contact on said top surface of said lower copper feature;
- measuring electrical characteristics between said upper copper layer and said electrical contact on said top surface of said lower copper feature, said electrical characteristics being selected from the group consisting of CV characteristics, I-V characteristics, and resistivity.

20. The structure of claim 19, wherein:
said upper barrier layer is Ta, and said first and second upper cap layers are silicon nitride.

* * * * *